United States Patent
Heuwieser et al.

(10) Patent No.: US 11,905,617 B2
(45) Date of Patent: Feb. 20, 2024

(54) METHOD FOR PRODUCING SEMICONDUCTOR WAFERS OF MONOCRYSTALLINE SILICON BY PULLING A SINGLE SILICON CRYSTAL FROM A MELT CONTAINED IN A CRUCIBLE AND CONTINUALLY CHANGING THE ROTATIONAL DIRECTION OF THE CRUCIBLE

(71) Applicant: Siltronic AG, Munich (DE)

(72) Inventors: Walter Heuwieser, Stammham (DE); Karl Mangelberger, Ach (AT); Juergen Vetterhoeffer, Burghausen (DE)

(73) Assignee: SILTRONIC AG, Munich (DE)

( * ) Notice: Subject to any disclaimer, the term of this patent is extended or adjusted under 35 U.S.C. 154(b) by 197 days.

(21) Appl. No.: 17/636,370

(22) PCT Filed: Aug. 5, 2020

(86) PCT No.: PCT/EP2020/072014
§ 371 (c)(1),
(2) Date: Feb. 18, 2022

(87) PCT Pub. No.: WO2021/043523
PCT Pub. Date: Mar. 11, 2021

(65) Prior Publication Data
US 2022/0298670 A1    Sep. 22, 2022

(30) Foreign Application Priority Data
Sep. 2, 2019 (DE) ............... 10 2019 213 236.7

(51) Int. Cl.
*C30B 15/30* (2006.01)
*C30B 29/06* (2006.01)
*C30B 30/04* (2006.01)

(52) U.S. Cl.
CPC ............. *C30B 15/30* (2013.01); *C30B 29/06* (2013.01); *C30B 30/04* (2013.01)

(58) Field of Classification Search
CPC ......... C30B 15/00; C30B 15/20; C30B 15/30; C30B 29/00; C30B 29/02; C30B 29/06; C30B 30/00; C30B 30/04
(Continued)

(56) References Cited

U.S. PATENT DOCUMENTS 5,215,620 A * 6/1993 Kodama ............... C30B 15/305
117/15
2009/0235861 A1* 9/2009 Fujiwara ............... C30B 29/06
117/201
(Continued)

FOREIGN PATENT DOCUMENTS

CN    105247115 A    1/2016
CN    109576785 A    4/2019
(Continued)

*Primary Examiner* — Kenneth A Bratland, Jr.
(74) *Attorney, Agent, or Firm* — LEYDIG, VOIT & MAYER, LTD.

(57) ABSTRACT

A method produces semiconductor wafers of monocrystalline silicon. The method includes: pulling a cylindrical section of a single silicon crystal from a melt contained in a crucible, wherein the oxygen concentration in the cylindrical section is not more than $5 \times 10^{17}$ atoms/cm$^3$; subjecting the melt to a horizontal magnetic field; rotating the crucible at a rotational velocity and in a rotational direction during the pulling of the cylindrical section of the single crystal; and removing the semiconductor wafers of monocrystalline silicon from the cylindrical section of the single crystal. An amount of rotational velocity, averaged over time, is less than 1 rpm and the rotational direction is changed continually and the amplitude of the rotational velocity before and (Continued)

after the change in the rotational direction is not less than 0.5 rpm and not more than 3.0 rpm.

3 Claims, 2 Drawing Sheets

(58) Field of Classification Search
USPC ....... 117/11, 13, 19–20, 200, 206, 208, 218, 117/928, 931–932
See application file for complete search history.

(56) References Cited

U.S. PATENT DOCUMENTS

2009/0249996 A1 10/2009 Watanabe
2016/0068992 A1 3/2016 Sakurada et al.

FOREIGN PATENT DOCUMENTS

| | | |
|---|---|---|
| DE | 102010028924 A1 | 3/2011 |
| DE | 112014002183 T5 | 1/2016 |
| JP | H0692775 A | 4/1994 |
| JP | H09175895 A | 7/1997 |

* cited by examiner

METHOD FOR PRODUCING SEMICONDUCTOR WAFERS OF MONOCRYSTALLINE SILICON BY PULLING A SINGLE SILICON CRYSTAL FROM A MELT CONTAINED IN A CRUCIBLE AND CONTINUALLY CHANGING THE ROTATIONAL DIRECTION OF THE CRUCIBLE

CROSS REFERENCE TO RELATED APPLICATIONS

This application is a U.S. National Phase application under 35 U.S.C. § 371 of International Application No. PCT/EP2020/072014, filed on Aug. 5, 2020, and claims benefit to German Patent Application No. DE 10 2019 213 236.7, filed on Sep. 2, 2019. The International Application was published in German on Mar. 11, 2021 as WO 2021/043523 A1 under PCT Article 21(2).

FIELD

The present application is directed to producing semiconductor wafers of monocrystalline silicon.

BACKGROUND

Semiconductor wafers of monocrystalline silicon are produced on the industrial scale. A large number of such semiconductor wafers come about from the removal of the semiconductor wafers from the cylindrical section of a monocrystal which has been pulled from a melt which was contained in a crucible. This method for producing the single crystal is also referred to as the Czochralski (CZ) method. The semiconductor wafers produced are typically processed further into electronic components.

Certain applications, especially in the field of power electronics, require semiconductor wafers of comparatively high diameter, containing interstitial oxygen (referred to below simply as oxygen) in comparatively low concentration within comparatively narrow limits. In this description, the concentration of oxygen is understood to be comparatively low if the value thereof as determined by the new ASTM is not more than $5 \times 10^{17}$ atoms/cm$^3$.

DE 10 2010 028 924 A1 describes how the concentration of oxygen in the single crystal can be reduced by exposing the melt to a horizontal magnetic field and by lowering the rotational velocity of the crucible.

Recommendations in JP 9 175 895 A2, furthermore, include that the rotational velocity of the crucible be increased periodically, starting from a base rotational velocity, and that the base rotational velocity and the amplitude of the increase be raised as a function of the length of the single crystal grown.

The present inventors have ascertained that, while such teachings, if observed, do allow the concentration of oxygen in the single crystal to be lowered to a comparatively low value, there is nevertheless comparatively sharp variation in the concentration over the length of the single crystal.

SUMMARY

In an embodiment, the present disclosure provides a method that produces semiconductor wafers of monocrystalline silicon. The method includes: pulling a cylindrical section of a single silicon crystal from a melt contained in a crucible, wherein the oxygen concentration in the cylindrical section is not more than 5×1017 atoms/cm3; subjecting the melt to a horizontal magnetic field; rotating the crucible at a rotational velocity and in a rotational direction during the pulling of the cylindrical section of the single crystal; and removing the semiconductor wafers of monocrystalline silicon from the cylindrical section of the single crystal. An amount of rotational velocity, averaged over time, is less than 1 rpm and the rotational direction is changed continually and the amplitude of the rotational velocity before and after the change in the rotational direction is not less than 0.5 rpm and not more than 3.0 rpm.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Aspects of the present disclosure diminish axial fluctuations in the oxygen concentration.

According to an aspect of the present disclosure a method for producing semiconductor wafers of monocrystalline silicon is provided, which includes: pulling a cylindrical section of a single silicon crystal from a melt contained in a crucible; subjecting the melt to a horizontal magnetic field; rotating the crucible at a rotational velocity and in a rotational direction during the pulling of the cylindrical section of the single crystal; and removing the semiconductor wafers of monocrystalline silicon from the cylindrical section of the single crystal. The amount of rotational velocity, averaged over time, is less than 1 rpm and the rotational direction is changed continually and the amplitude of the rotational velocity before and after the change in the rotational direction is not less than 0.5 rpm and not more than 3.0 rpm.

By employing aspects of the present disclosure, it is possible to reduce axial fluctuations in the concentration of oxygen in the cylindrical section of the single crystal, expressed as the difference between maximum concentration and minimum concentration, by more than half.

Aspects of the present disclosure can be utilized independently of the diameter of the cylindrical section of the single crystal. The concentration of oxygen in the cylindrical section of the single crystal is not more than $5 \times 10^{17}$ atoms/cm$^3$. The method of an aspect of the present disclosure can be used to produce semiconductor wafers having a diameter of at least 200 mm, more preferably at least 300 mm.

According to an aspect of the present disclosure that diminishes axial fluctuations in the oxygen concentration, the rotational velocity of the crucible as a time average (average rotational velocity) is less than 1 rpm, preferably not more than 0.7 rpm. The direction of the average rotational velocity of the crucible may match or be opposite to the direction of the rotational velocity of the single crystal. The directions preferably match. Furthermore, the rotational direction of the crucible is changed continually, preferably periodically. The length of a period is preferably 10 to 100 s. Before and after the change in the rotational direction, the amplitude of the rotational velocity is not less than 0.5 rpm and not more than 3.0 rpm. Allowing the amplitude to overshoot the upper limit is not advisable, unless the aim is for a concentration of oxygen in the single crystal of more than $5 \times 10^{17}$ atoms/cm³.

In the region of the phase boundary between the growing single crystal and the melt, the horizontal magnetic field has an intensity of preferably not less than 0.2 T and not more than 0.4 T.

Figure 1:
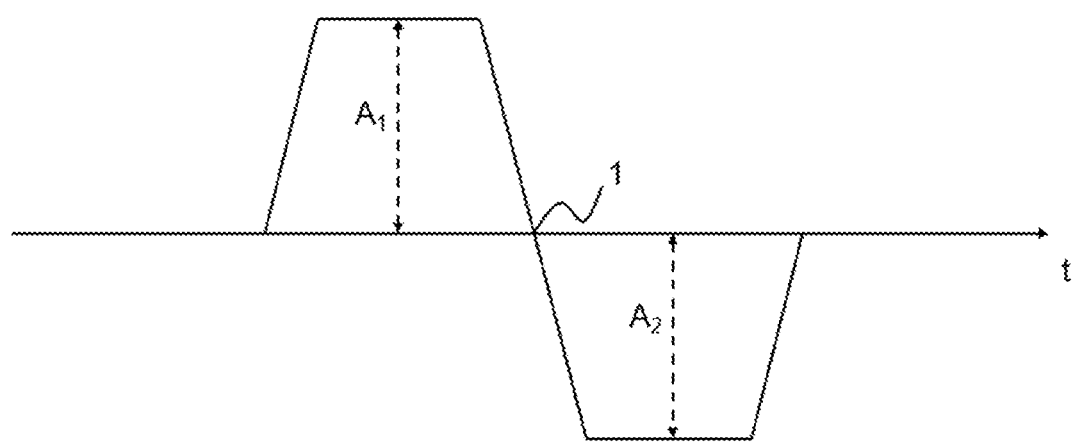
FIG. 1 shows schematically the time profile of the rotational velocity of the crucible over a period.

As represented in FIG. 1, the crucible during one period is accelerated in a rotational direction up to an amplitude $A_1$ and braked again and subsequently, up to the timing 1 of the change in the rotational direction, is accelerated in the opposite rotational direction to an amplitude $A_2$ and braked again. The amplitudes $A_1$ and $A_2$ are different in their amount, so resulting in an average rotational velocity in one of the rotational directions.

EXAMPLE

Two groups of single silicon crystals with a diameter of 300 mm were pulled by the CZ method and semiconductor wafers were removed from the respective cylindrical section of the single crystals. A first group of the single crystals was pulled in accordance with the present disclosure—that is, in particular, by changing the rotational direction of the crucible, during the pulling of the cylindrical section of the single crystal, with a period duration of 40 s and an amplitude of not more than 1.1 rpm. In contrast to this, the other group of single crystals was pulled under otherwise identical conditions without any change in the rotational direction of the crucible. For both groups, the average rotational velocity of the crucible was 0.6 rpm.

Figure 2:
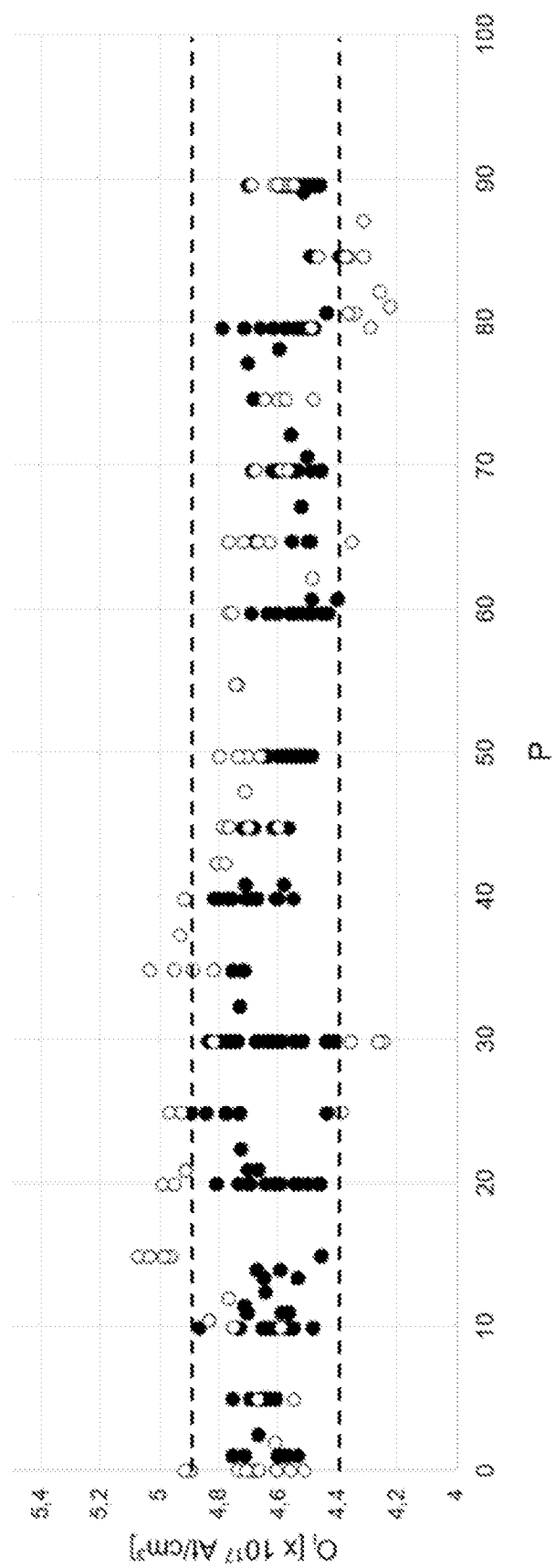
FIG. 2 shows the concentration of oxygen in two groups of single silicon crystals as a function of the axial position in the cylindrical section of the single crystals.

Determining the oxygen concentrations as a function of a relative axial position P in the cylindrical section of the single crystals produced the outcome represented in FIG. 2. Accordingly, when the method of the present disclosure is employed, it is possible to expect the oxygen concentration to remain within a comparatively narrow corridor. In the present case, all of the data points (solid circles), assigned to single crystals pulled in accordance with the invention, lay within the corridor delimited by dashed lines, with an oxygen concentration of $4.4 \times 10^{17}$ atoms/cm³ to approximately $4.9 \times 10^{17}$ atoms/cm³.

The description above of illustrative embodiments should be understood as an example. The disclosure therein enables a skilled person, on the one hand, to understand the present invention and the advantages associated with it, and on the other hand, within the understanding of the skilled person, also embraces obvious alterations and modifications to the structures and methods described. The intention is therefore that all such alterations and modifications, and also equivalents, should be covered by the scope of protection of the claims. While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for producing semiconductor wafers of monocrystalline silicon, the method comprising:
   pulling a cylindrical section of a single silicon crystal from a melt contained in a crucible, wherein an oxygen concentration in the cylindrical section is not more than $5 \times 10^{17}$ atoms/cm³
   subjecting the melt to a horizontal magnetic field;
   rotating the crucible at a rotational velocity and in a rotational direction during the pulling of the cylindrical section of the single crystal; and
   removing the semiconductor wafers of monocrystalline silicon from the cylindrical section of the single crystal,
   wherein an amount of rotational velocity, averaged over time, is less than 1 rpm and the rotational direction is changed continually and the amplitude of the rotational velocity before and after the change in the rotational direction is not less than 0.5 rpm and not more than 3.0 rpm.

2. The method as claimed in claim 1, wherein the rotational direction is changed periodically with a period length of 10 s to 100 s.

3. The method as claimed in claim 1, wherein the amount of the rotational velocity, averaged over time, is not more than 0.7 rpm.

* * * * *